(12) United States Patent
Hong et al.

(10) Patent No.: US 11,462,603 B2
(45) Date of Patent: Oct. 4, 2022

(54) LIGHT EMITTING DISPLAY DEVICE AND METHOD FOR MANUFACTURING THE SAME

(71) Applicant: SAMSUNG DISPLAY CO., LTD., Yongin-si (KR)

(72) Inventors: Sang Min Hong, Cheonan-si (KR); Hee Seong Jeong, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/666,595

(22) Filed: Oct. 29, 2019

(65) Prior Publication Data
US 2020/0243639 A1  Jul. 30, 2020

(30) Foreign Application Priority Data
Jan. 24, 2019  (KR) .................. 10-2019-0009439

(51) Int. Cl.
*H01L 27/32*   (2006.01)

(52) U.S. Cl.
CPC .................. *H01L 27/326* (2013.01)

(58) Field of Classification Search
None
See application file for complete search history.

(56) References Cited

U.S. PATENT DOCUMENTS

| 2015/0170563 A1* | 6/2015 | Bang .................. H01L 27/3262 257/40 |
| 2016/0133190 A1* | 5/2016 | Kim ...................... G09G 3/2011 345/80 |
| 2016/0210905 A1* | 7/2016 | Lee ....................... G09G 3/3233 |
| 2016/0233285 A1* | 8/2016 | Lee ....................... H01L 51/5228 |
| 2017/0005286 A1* | 1/2017 | Yun ...................... H01L 27/3211 |
| 2017/0162637 A1* | 6/2017 | Choi ................... H01L 51/5237 |

FOREIGN PATENT DOCUMENTS

| KR | 10-2013-0016937 | 2/2013 |
| KR | 10-2014-0072711 | 6/2014 |
| KR | 10-2015-0019332 | 2/2015 |
| KR | 10-2018-0049361 | 5/2018 |
| KR | 10-2018-0083469 | 7/2018 |

* cited by examiner

*Primary Examiner* — Khaja Ahmad
(74) *Attorney, Agent, or Firm* — F. Chau & Associates, LLC

(57) ABSTRACT

A light emitting display device includes: a substrate; a semiconductor layer disposed on the substrate; a first insulating layer disposed on the semiconductor layer; a first gate conductor disposed on the first insulating layer; a second insulating layer disposed on the first gate conductor; a second gate conductor disposed on the second insulating layer; an interlayer insulating layer disposed on the second gate conductor; a data conductor disposed on the interlayer insulating layer; a passivation layer disposed on the data conductor; a diode first electrode disposed on the passivation layer; a partition wall disposed on the diode first electrode and including an opening overlapping the diode first electrode; a light emitting layer; and a diode second electrode. The data conductor includes a first inclined surface and a second inclined surface, and an area of the first inclined surface is different from an area of the second inclined surface.

8 Claims, 10 Drawing Sheets

LIGHT EMITTING DISPLAY DEVICE AND METHOD FOR MANUFACTURING THE SAME

CROSS-REFERENCE TO RELATED APPLICATION

This application claims priority under 35 § 119 to Korean Patent Application Na 10-2019-0009439 filed in the Korean Intellectual Property Office on Jan. 24, 2019, the disclosure of which is incorporated by reference herein in its entirety.

TECHNICAL FIELD

The present invention relates to a light emitting display device and a method for manufacturing the same.

DISCUSSION OF RELATED ART

In general, when a light emitting display device has a self-emission characteristic, it does not use an additional light source. Therefore, it is possible to reduce thickness and weight of a self-emissive display device. Further, the self-emissive light emitting display device may have additional qualities such as low power consumption, high luminance, and high response speed.

The self-emissive light emitting display device may include a light emitting diode including two electrodes and a light emitting layer disposed between the two electrodes. When holes and electrons are injected into the light emitting layer from the two electrodes, light is emitted as excitons, which are formed from the injected holes combining with the injected electrons, transition to a ground state from an excited state.

In the self-emissive light emitting display device, an electrode overlapping the light emitting layer may have a protrusion-depression shape. This may cause a color change when a viewing angle changes.

SUMMARY

According to an exemplary embodiment of the present invention, a light emitting display device includes: a substrate; a semiconductor layer disposed on the substrate; a first gate insulating layer disposed on the semiconductor layer; a first gate conductor disposed on the first gate insulating layer; a second gate insulating layer disposed on the first gate conductor; a second gate conductor disposed on the second gate insulating layer; an interlayer insulating layer disposed on the second gate conductor; a data conductor disposed on the interlayer insulating layer; a passivation layer disposed on the data conductor; a diode first electrode disposed on the passivation layer; a partition wall disposed on the diode first electrode and including an opening overlapping the diode first electrode; a light emitting layer disposed on the diode first electrode in the opening; and a diode second electrode disposed on the light emitting layer, wherein the data conductor includes a first inclined surface and a second inclined surface opposing the first inclined surface, and an area of the first inclined surface is different from an area of the second inclined surface.

In an exemplary embodiment of the present invention, the data conductor overlaps the opening.

In an exemplary embodiment of the present invention, the data conductor further includes a third inclined surface and a fourth inclined surface opposing the third inclined surface, wherein the first inclined surface includes a first inclined surface overlap portion overlapping the opening, wherein the second inclined surface includes a second inclined surface overlap portion overlapping the opening, wherein the third inclined surface includes a third inclined surface overlap portion overlapping the opening, and wherein the fourth inclined surface includes a fourth inclined surface overlap portion overlapping the opening.

In an exemplary embodiment of the present invention, a sum of an area of the first inclined surface overlap portion and an area of the third inclined surface overlap portion is the same as a sum of an area of the second inclined surface overlap portion and an area of the fourth inclined surface overlap portion.

In an exemplary embodiment of the present invention, the area of the first inclined surface is larger than the area of the second inclined surface.

In an exemplary embodiment of the present invention, the first inclined surface includes protrusions and indentations alternatively positioned.

In an exemplary embodiment of the present invention, an upper surface of the passivation layer includes protrusions and depressions.

In an exemplary embodiment of the present invention, the diode first electrode includes protrusions and depressions.

In an exemplary embodiment of the present invention, the protrusions and depressions of the diode first electrode overlap the opening of the partition wall.

According to an exemplary embodiment of the present invention, a method for manufacturing a light emitting display device includes: forming a semiconductor layer on a substrate; forming a first gate insulating layer on the semiconductor layer; forming a first gate conductor on the first gate insulating layer; forming a second gate insulating layer on the first gate conductor; forming a second gate conductor on the second gate insulating layer; forming an interlayer insulating layer on the second gate conductor; forming a data conductor on the interlayer insulating layer; forming a passivation layer on the data conductor; forming a diode first electrode on the passivation layer; forming a partition wall on the diode first electrode, wherein the partition wall includes an opening overlapping the diode first electrode; forming a light emitting layer on the diode first electrode in the opening, and forming a diode second electrode on the light emitting layer, wherein the data conductor includes a first left inclined surface and a first right inclined surface, and an area of the first left inclined surface is different from an area of the first right inclined surface.

In an exemplary embodiment of the present invention, the forming of the data conductor includes: forming a data metal layer on the interlayer insulating layer; forming a photosensitive layer on the data metal layer; forming a first photosensitive layer pattern by irradiating light onto the photosensitive layer while using a photomask; etching the data metal layer using the first photosensitive layer pattern as a first mask to form a preliminary data conductor; forming a second photosensitive layer pattern by ashing the first photosensitive layer pattern; and etching the preliminary data conductor using the second photosensitive layer pattern as a second mask.

In an exemplary embodiment of the present invention, the photomask includes a light transmitting portion, a light blocking portion, and a light semi-transmitting portion, the first photosensitive layer pattern includes a first portion and a second portion having a thickness that is thinner than a thickness of the first portion, and the first portion corresponds to the light transmitting portion and the second portion corresponds to the light semi-transmitting portion.

In an exemplary embodiment of the present invention, the second photosensitive layer pattern is formed by removing the second portion and reducing the thickness of the first portion.

In an exemplary embodiment of the present invention, the data conductor overlaps the opening.

In an exemplary embodiment of the present invention, the data conductor further includes a second left inclined surface and a second right inclined surface opposing the second left inclined surface, wherein the first left inclined surface includes a first left inclined surface overlap portion overlapping the opening, wherein the first right inclined surface includes a first right inclined surface overlap portion overlapping the opening, wherein the second left inclined surface includes a second left inclined surface overlap portion overlapping the opening, and wherein the second right inclined surface includes a second right inclined surface overlap portion overlapping the opening.

In an exemplary embodiment of the present invention, a sum of an area of the first left inclined surface overlap portion and an area of the second left inclined surface overlap portion is the same as a sum of an area of the first right inclined surface overlap portion and an area of the second right inclined surface overlap portion.

In an exemplary embodiment of the present invention, an area of the first left inclined surface is larger than an area of the first right inclined surface.

In an exemplary embodiment of the present invention, protrusions and depressions are formed in an upper surface of the passivation layer.

In an exemplary embodiment of the present invention, the diode first electrode includes protrusions and depressions.

In an exemplary embodiment of the present invention, the protrusions and depressions of the diode first electrode overlap the opening of the partition wall.

According to an exemplary embodiment of the present invention, a light emitting display device includes: a substrate; a transistor disposed on the substrate and including a first gate electrode; an interlayer insulating layer disposed on the first gate electrode; a data conductor disposed on the interlayer insulating layer and including a data connecting member and a driving voltage line; a passivation layer disposed on the data conductor; a diode first electrode disposed on the passivation layer; a partition wall disposed on the diode first electrode and including an opening overlapping the diode first electrode; a light emitting layer disposed on the diode first electrode in the opening; and a diode second electrode disposed on the light emitting layer, wherein the data connecting member includes a first inclined surface and a second inclined surface opposing the first inclined surface, and the driving voltage line includes a third inclined surface and a fourth inclined surface opposing the third inclined surface, wherein the first inclined surface includes a first portion overlapping the opening, wherein the second inclined surface includes a second portion overlapping the opening, wherein the third inclined surface includes a third portion overlapping the opening, wherein the fourth inclined surface includes a fourth portion overlapping the opening, and wherein a sum of an area of the first portion and an area of the third portion is the same as a sum of an area of the second portion and an area of the fourth portion.

In an exemplary embodiment of the present invention, the diode first electrode overlaps the data connecting member and the driving voltage line.

DETAILED DESCRIPTION OF THE EMBODIMENTS

Figure 1:
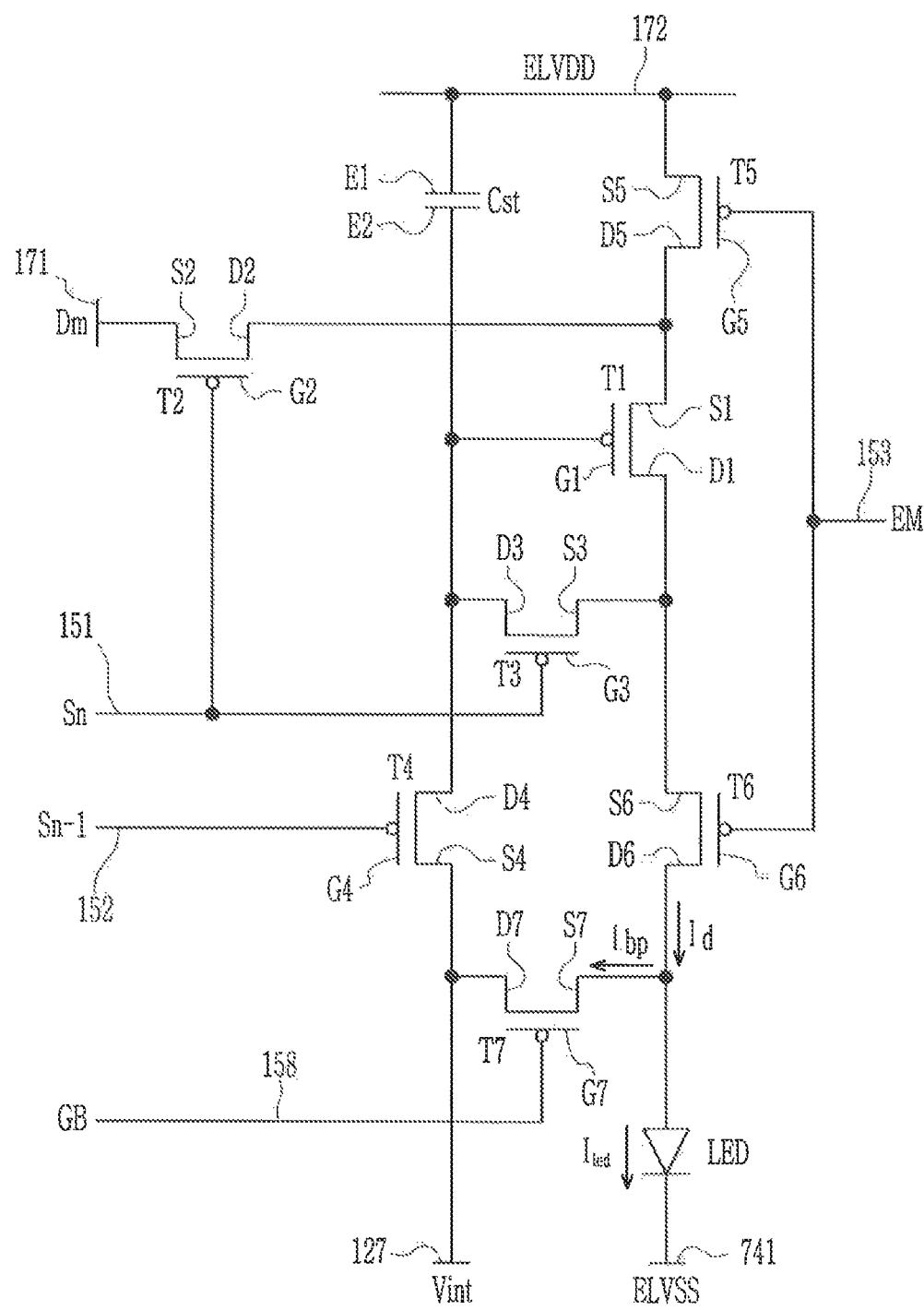
FIG. 1 illustrates a circuit diagram of one pixel of a light emitting display device according to an exemplary embodiment of the present invention.

Exemplary embodiments of the present invention will be described more fully hereinafter with reference to the accompanying drawings. As those skilled in the art would realize, the described exemplary embodiments may be modified in various different ways, and thus should not be limited to the embodiments set forth herein.

In the figures, like reference numerals may denote like elements or features, and thus their descriptions may be omitted.

Further, in the drawings, the size and thickness of each element may be exaggerated for clarity.

It will be understood that when an element such as a layer, film, region, or substrate is referred to as being "on" another element, it can be directly on the other element or intervening elements may also be present.

Further, throughout the specification, the phrase "on a plane" may mean viewing a target portion from the top, and the phrase "on a cross-section" may mean viewing a cross-section formed by vertically cutting a target portion from the side. FIG. 1 illustrates an equivalent circuit diagram of one pixel of a light emitting display device according to an exemplary embodiment of the present invention.

Referring to FIG. 1, one pixel of a light emitting display device according to the present exemplary embodiment includes a plurality of transistors T1, T2, T3, T4, T5, T6, and T7 connected to a plurality of signal lines 127, 151, 152, 153, 158, 171, 172, and 741, a storage capacitor Cst, and a light emitting diode LED.

The plurality of transistors T1, T2, T3, T4, T5, T6, and T7 include a driving transistor T1, switching transistors T2 and T3 connected to a first scan line 151, that is, a second transistor T2 and a third transistor T3, and the other transistors are transistors (e.g., hereinafter referred to as compensating transistors) for performing operations to drive the light emitting diodes LED.

The compensating transistors T4, T5, T6, and T7 may include a fourth transistor T4, a fifth transistor T5, a sixth transistor T6, and a seventh transistor T7.

The plurality of signal lines 127, 151, 152, 153, 158, 171, 172, and 741 may include the first scan line 151, a second scan line 152, a light emitting control line 153, a bypass control line 158, a data line 171, a driving voltage line 172, an initializing voltage line 127, and a common voltage line 741. The bypass control line 158 may be a part of the second scan line 152 or may be electrically connected to the second scan line 152.

The first scan line 151 is connected to a gate driver to transmit a scan signal Sn to the second transistor T2 and the third transistor T3. The second scan line 152 is connected to the gate driver, and transmits a front scan signal Sn-1, which is applied to the pixel disposed at a previous stage, to the fourth transistor T4. The light emitting control line 153 is connected to a light emitting control portion, and transmits a light emitting control signal EM for controlling a light emitting time of the light emitting diode LED to the fifth transistor T5 and the sixth transistor T6. The bypass control line 158 transmits a bypass signal GB to the seventh transistor T7.

The data line 171 is a line for transmitting a data voltage Dm generated in the data driving portion, and luminance at which the light emitting diode (LED) (e.g., also referred to as the light emitting element) emits varies in accordance with the data voltage Dm. The driving voltage line 172 applies a driving voltage ELVDD. The initializing voltage line 127 transmits an initializing voltage Vint for initializing the driving transistor T1. The common voltage line 741 applies a common voltage ELVSS. For example, voltages applied to the driving voltage line 1172, the initializing voltage line 127, and the common voltage line 741 may be constant.

Hereinafter, a plurality of transistors will be described. For example, each transistor includes a gate electrode, a first electrode, and a second electrode.

The driving transistor T1 is a transistor that adjusts a current outputted according to the applied data voltage Dm. An outputted driving current Id is applied to the light emitting diode diode LED to adjust brightness of the light emitting diode LED according to the data voltage Dm. In addition, a first electrode S1 of the driving transistor T1 is disposed to receive the driving voltage ELVDD. The first electrode S1 is connected to the driving voltage line 172 via the fifth transistor T5, In addition, the first electrode S1 of the driving transistor T1 is connected connected to a second electrode D2 of the second transistor T2 to receive the data voltage Dm. A second electrode D1 (e.g., an output electrode) of the driving transistor T1 is disposed to be able to output a current to the light emitting diode LED. The second electrode D1 of the driving driving transistor T1 is connected to an anode of the light emitting diode LED via the sixth transistor T6, In addition, a gate electrode G1 of the driving transistor T1 is connected to one electrode (e.g., a second storage electrode E2) of the storage capacitor Cst. Accordingly, a voltage of the gate electrode G1 of the driving transistor T1 is changed according to a voltage stored in the storage capacitor Cst, so that a driving current Id outputted from the driving transistor T1 is changed.

The second transistor T2 is a transistor for receiving the data voltage Dm for the pixel. A gate electrode G2 of the second transistor T2 is connected to the first scan line 151, and a first electrode S2 of the second transistor T2 is connected to the data line 171. A second electrode D2 of the second transistor T2 is connected to the first electrode S1 of the driving transistor T1. When the second transistor T2 is turned on in response to the first scan signal Sn transmitted through the scan line 151, the data voltage Dm transmitted through the data line 171 is transmitted to the first electrode S1 of the driving transistor T1.

The third transistor T3 is a transistor that allows a compensation voltage (e.g., a voltage equal to the data voltage Dm plus a threshold voltage) in which the data voltage Dm is changed while passing through the driving transistor T1 to be transmitted to a second storage electrode E2 of the storage capacitor Cst. A gate electrode G3 of the third transistor T3 is connected to the first scan line 151, and a first electrode S3 of the third transistor T3 is connected to the second electrode D1 of the driving transistor T1. A second electrode D3 of the third transistor T3 is connected to the second storage electrode E2 of the storage capacitor Cst and the gate electrode G1 of the driving transistor T1. The third transistor T3 connects the gate electrode G1 and the second electrode D1 of the driving transistor T1 in response to the scan signal Sn received through the scan line 151, and it also connects the second electrode D1 of the driving transistor T1 and the second storage electrode E2 of the storage capacitor Cst.

The fourth transistor T4 serves to initialize the gate electrode G1 of the driving transistor T1 and the second storage electrode E2 of the storage capacitor Cst. A gate electrode G4 of the fourth transistor T4 is connected to the second scan line 152, and a first electrode S4 of the fourth transistor T4 is connected to the initializing voltage line 127. A second electrode D4 of the fourth transistor T4 is connected to the second storage electrode E2 of the storage capacitor Cst and the gate electrode G1 of the driving transistor T1 via the second electrode D3 of the third transistor T3. The fourth transistor T4 transmits the initializing voltage Vint to the gate electrode G1 of the driving transistor T1 and to the second storage electrode E2 of the storage capacitor Cst in response to the second scan signal Sn-1 received through the second scan line 152. Thus, a gate voltage of the gate electrode G1 of the driving transistor T1 and the storage capacitor Cst are initialized. For example, the initializing voltage Vint has a low voltage voltage value, and thus, the initialization voltage Vint may be a voltage capable of turning on the driving transistor T1.

The fifth transistor T5 serves to transmit the driving voltage ELVDD to the driving transistor T1. A gate electrode G5 of the fifth transistor T5 is connected to the light emitting control line 153, and a first electrode S5 of the fifth transistor T5 is connected to the driving voltage line 172. A second electrode D5 of the fifth transistor T5 is connected to the first electrode S1 of the driving transistor T1.

The sixth transistor T6 serves to transmit the driving current Id outputted from the driving transistor T1 to the light emitting diode LED. A gate electrode G6 of the sixth transistor T6 is connected to the light emitting control line 153, and a first electrode S6 of the sixth transistor T6 is connected to the second electrode D1 of the driving transistor T1. A second electrode D6 of the sixth transistor T6 is connected to the anode of the light emitting diode LED.

The fifth transistor T5 and the sixth transistor T6 are simultaneously turned on by the light emitting control signal EM received through the light emitting control line 153, and when the driving voltage ELVDD is applied to the first electrode S1 of the driving transistor T1 through the fifth transistor T5, the driving transistor T1 outputs the driving current Id according to a voltage (e.g., a voltage of the second storage electrode E2 of the storage capacitor Cst) of the gate electrode G1 of the driving transistor T1. The outputted driving current Id is transmitted to the light emitting diode LED through the sixth transistor T6. The light emitting diode LED emits light as a current $I_{led}$ flows through the light emitting diode LED.

The seventh transistor T7 serves to initialize the anode of the light emitting diode LED. A gate electrode G7 of the seventh transistor T7 is connected to the bypass control line 158, a first electrode S7 of the seventh transistor T7 is connected to the anode of the light emitting diode LED, and a second electrode D7 of the seventh transistor T7 is connected to the initializing voltage line 127. The bypass control line 158 may be connected to the second scan line 152, and the bypass signal GB may be the same timing signal as the second scan signal Sn-1. The bypass control line 158 is not connected to the second scan line 152, and may transmit a separate signal that is different from the second scan signal Sn-1. When the seventh transistor T7 is turned on by the bypass signal GB, the initializing voltage Vint is applied to the anode of the light emitting diode OLED to initialize it.

A first storage electrode E1 of the storage capacitor Cst is connected to the driving voltage line 172, and the second storage electrode E2 is connected to the gate electrode G1 of the driving transistor T1, the second electrode D3 of the third transistor T3, and the second electrode D4 of the fourth transistor T4. Accordingly, the second storage electrode E2 determines the voltage of the gate electrode G1 of the driving transistor T1, and the second storage electrode E2 receives the data voltage Dm through the second electrode D3 of the third transistor T3, or the second storage electrode E2 receives the initializing voltage Vint through the second electrode D4 of the fourth transistor T4.

The anode of the light emitting diode LED is connected to the second electrode D6 of the sixth transistor T6 and the first electrode S7 of the seventh transistor T7, and the cathode of the light emitting diode LED is connected to the common voltage line 741 for transmitting the common voltage ELVSS.

In the exemplary embodiment of the present invention, the circuit of one pixel of the light emitting display device includes seven transistors T1 to T7 and one capacitor Cst, but the present invention is not limited thereto, and the number of transistors and the number of capacitors and connections therebetween may be varied.

Now, a detailed structure of the pixel of the light emitting display device shown in FIG. 1 will be described with reference to FIGS. 2 to 5 with reference to FIG. 1 according to an exemplary embodiment of the present invention.

Figure 2:
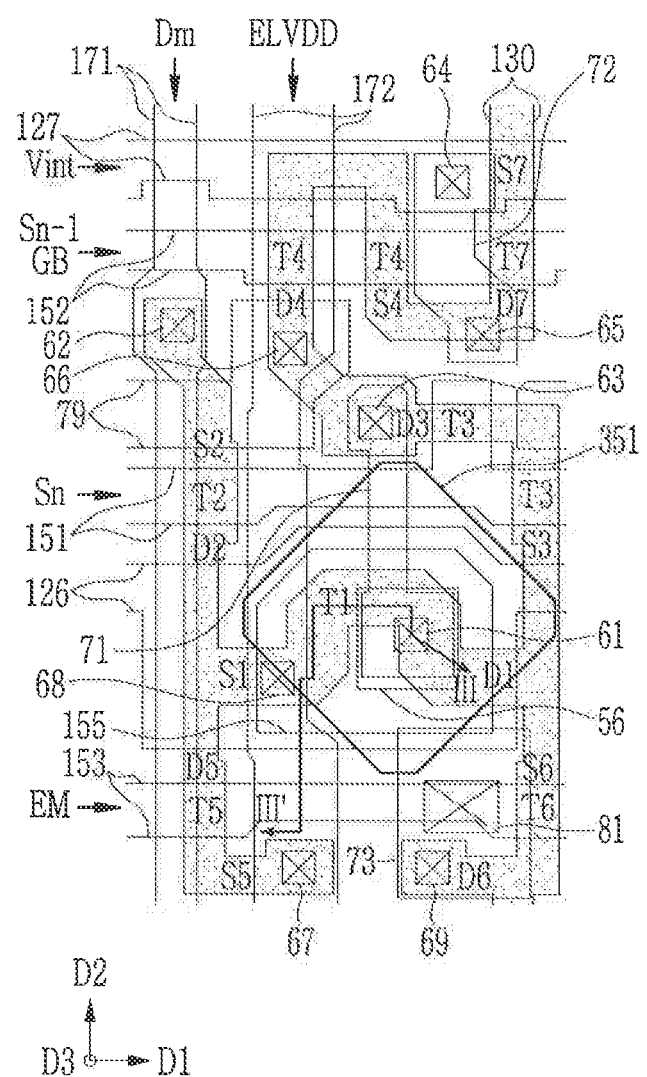
FIG. 2 illustrates a schematic plan view of one pixel of a light emitting display device according to an exemplary embodiment of the present invention.
Figure 3:
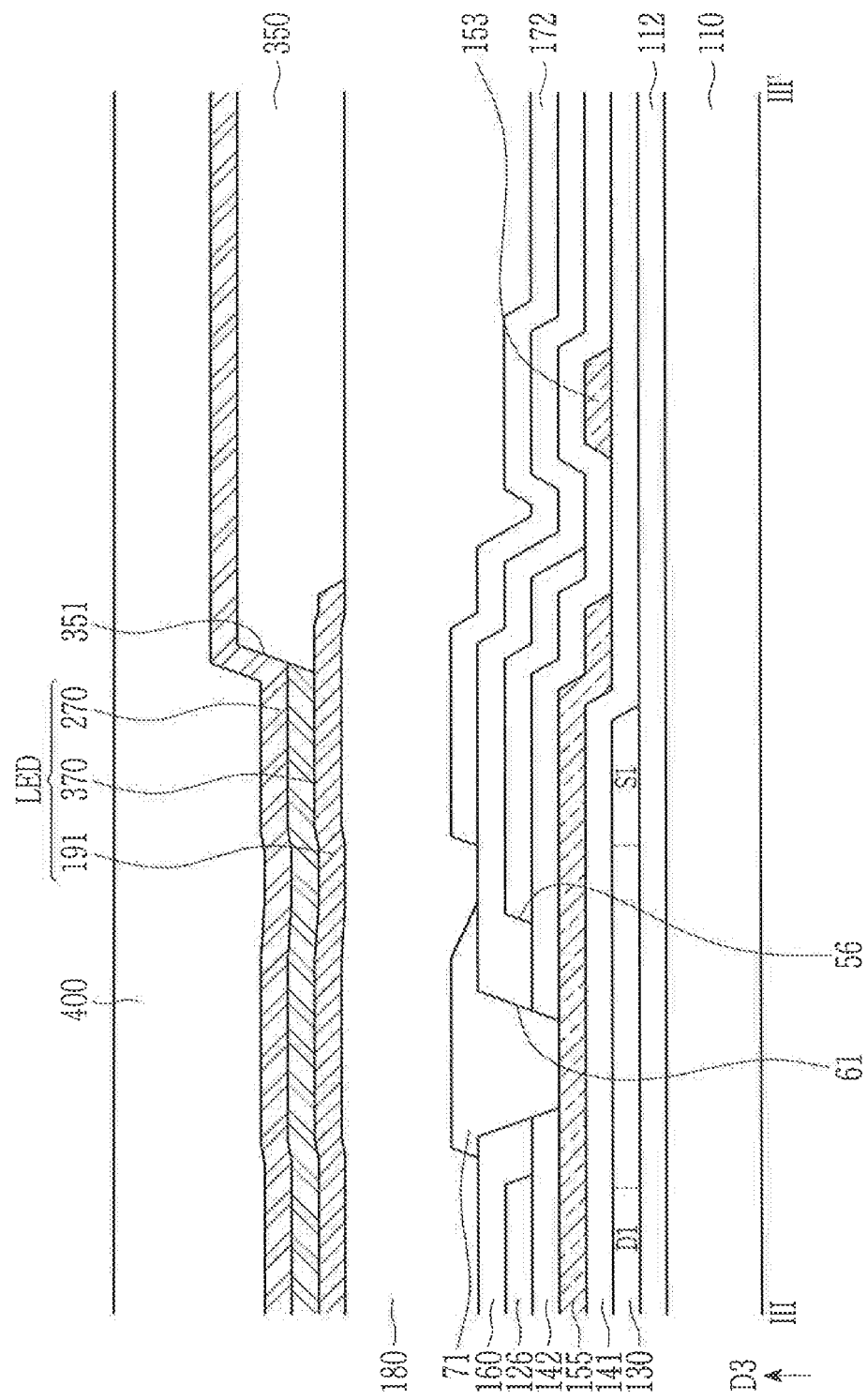
FIG. 3 illustrates a cross-sectional view taken along line III-III' of the light emitting display device of FIG. 2 according to an exemplary embodiment of the present invention.

FIG. 2 illustrates a schematic plan view of one pixel of a light emitting display device according to an exemplary embodiment of the present invention. FIG. 3 illustrates a cross-sectional view taken along line III-III' of the light emitting display device of FIG. 2 according to an exemplary embodiment of the present invention.

Referring to FIG. 2, the light emitting display device according to the present exemplary embodiment includes the first scan line 151 extending along a first direction D1 and transmitting the scan signal Sn, the second scan line 152 for transmitting the second scan signal Sn-1, the light emitting control line 153 for transmitting the light emitting control signal EM, and the initializing voltage line 127 for transmitting the initializing voltage Vint. The bypass signal GB is transmitted through the second scan line 152.

The light emitting display device according to the present exemplary embodiment includes the data line 171 extending along a second direction D2 substantially perpendicular to the first direction D and transmitting the data voltage Dm, and the driving voltage line 172 for transmitting the driving voltage ELVDD.

The light emitting display device according to the present exemplary embodiment includes the driving transistor T1, the second transistor T2, the third transistor T3, the fourth transistor T4, the fifth transistor T5, sixth transistor T6, the seventh transistor T7, the storage capacitor Cst, and the light emitting diode LED.

A channel of each of the driving transistor T1, the second transistor T2, the third transistor T3, the fourth transistor T4, the fifth transistor T5, the sixth transistor T6, and the seventh transistor T1 is positioned in a semiconductor layer 130, For example, the channel of each of the driving transistor T1, the second transistor T2, the third transistor T3, the fourth transistor T4, the fifth transistor T5, the sixth transistor T6, and the seventh transistor T7 includes a portion of the semiconductor layer 130, and the semiconductor layer 130 extends in at least one of the first direction D1 and the second direction D2. In addition, at least some of the first and second electrodes of the plurality of transistors T1, T2, T3, T4, T5, T6, and T7 are also positioned in the semiconductor layer 130. The semiconductor layer 130 (a portion in which shading is added in FIG. 2) may be bent in at least one of the first direction D1 and the second direction D2. For example, the semiconductor layer 130 may include a polycrystalline semiconductor such as polysilicon, or an oxide semiconductor.

The semiconductor layer 130 includes a channel, and a first doped region and a second doped region that are positioned at opposite sides of the channel. The first doped region and the second doped region respectively correspond to the first electrodes and the second electrodes of the plurality of transistors T1, T2, T3, T4, T5,T6, and T7. When one of the first doped region and the second doped region is a source region, the other is a drain region. In addition, in the semiconductor layer 130, regions between the first and second electrodes of two different transistors are also doped, so that the two transistors may be electrically connected to each other.

Each of the channels of the plurality of transistors T1, T2, T3, T4, T5, T6, and T7 overlaps the gate electrode of each of the transistors T1, T2, T3, T4, T5, T6, and T7, and is positioned between the first electrode and the second electrode of each of the transistors T1, T2, T3, T4, T5, T6, and T7. The plurality of transistors T1, T2, T3, T4, T5, T6, and T7 may have substantially the same stacked structure. Hereinafter, the driving transistor T1 will be described described in detail, and the remaining transistors T2, T3, T4, T5, T6, and T7 may be briefly described.

The driving transistor T1 includes a channel, a first gate electrode 155, the first electrode S1, and the second electrode D1. The channel of the driving transistor T1 is between the first electrode S1 and the second electrode D1, and overlaps the first gate electrode 155 in a plan view. For example, the channel is curved to extend to the plurality of transistors T1, T2, T3, T4, T5, T6, and T7. A driving range of the gate voltage Vg applied to the first gate electrode 155 of the driving transistor T1 is widened as a length of the channel increases, and the driving current Id increases in accordance with the gate voltage Vg. Accordingly, a gray of light emitted from the light emitting diode LED may be finely controlled by changing the gate voltage Vg, and the display quality of the light emitting display device may also be increased. In addition, since the channel extends in several directions rather than extending in one direction, effects due to directionality are offset in a manufacturing process, thereby reducing an effect of process dispersion. Therefore, it is possible to prevent degradation in image quality such as spot defects (for example, a luminance difference occurring between pixels even if the same data voltage Dm is applied) capable of occurring due to the characteristic of the driving transistor T1 that is varied according to the region of the display device due to the process dispersion. A shape of such a channel is not limited to the shape shown in the present exemplary embodiment, and may be varied.

The first gate electrode 155 overlaps the channel in a plan view. The first and second electrodes S1 and D1 are disposed at opposite sides of the channel. An extended portion of a storage line 126 is isolated and disposed on the first gate electrode 155. The extended portion of of the storage line 126 overlaps the first gate electrode 155 with a second gate insulating layer therebetween in a plan view to form the storage capacitor Cst. The extended portion of the storage line 126 is a first storage electrode (E1 of FIG. 1) of the storage capacitor Cst, and the first gate electrode 155 is a second storage electrode (E2 of FIG. 1), The extended portion of the storage line 126 is provided with an opening 56 so that the gate electrode 155 may be connected to a first data connecting member 71. In the opening 56, an upper surface of the first gate electrode 155 and the first data connecting member 71 are electrically connected through a contact opening 61. The first data connecting member 71 is connected to the second electrode D3 of the third transistor T3 to connect the first gate electrode 155 of the driving transistor T1 to the second electrode D3 of the third transistor T3.

The gate electrode of the second transistor T2 may be a portion of the first scan line 151. The data line 171 is connected to the first electrode S2 of the second transistor T2 through a contact opening 62. The first electrode S2 and the second electrode D2 may be disposed at opposite ends of the semiconductor layer 130.

The third transistor T3 may include two transistors adjacent to each other. In FIG. 2, denotations of 'T3' are shown where the semiconductor layer 130 is bent. For example, one transistor of the third transistor T3 may be at a portion of the semiconductor layer 130 extending in the first direction D1 away from the bend of the semiconductor layer 130, and the other transistor of the third transistor T3 may be at a portion of the semiconductor layer 130 extending in the second direction D2 away from the bend of the semiconductor layer 130. These two portions (e.g., transistors) serve as the third transistor T3, and the first electrode S3 of one third transistor T3 is connected to the second electrode D2 of the other third transistor T3. The gate electrodes of the two transistors T3 may be a part of the first scan line 151 and/or a part protruding upward from the first scan line 151. Such a structure may be regarded as a dual gate structure, and may block a leakage current from flowing. The first electrode S3 of the third transistor T3 is connected to the first electrode S6 of the sixth transistor T6 and the second electrode D1 of the driving transistor T1. The second electrode D3 of the third transistor T3 is connected to the first data connecting member 71 through a contact opening 63.

The fourth transistor T4 includes two fourth transistors T4, and the two fourth transistors T4 are formed at a position at which the second scan line 152 and the semiconductor layer 130 meet. The gate electrode of the fourth transistor T4 may be a part of the second scan line 152. The first electrode S4 of one fourth transistor T4 is connected to the second electrode D4 of the other fourth transistor T4. Such a structure may be regarded as a dual gate structure and may serve to block a leakage current. A second data connecting member 72 is connected to the first electrode S4 of the fourth transistor T4 through a contact opening 65, and the first data connecting member 71 is connected to the second electrode D4 of the fourth transistor T4 through the contact opening 63.

As described above, the third transistor T3 and the fourth transistor T4 may each be formed to have the dual gate structure to prevent a leakage current from being generated by blocking an electron movement path of a channel in an off state.

The gate electrode of the fifth transistor T5 may be a part of the light emitting control line 153. The driving voltage line 172 is connected to the first electrode S5 of the fifth transistor T5 through a contact opening 67, and the second electrode D5 is connected to the first electrode S1 of the driving transistor T1 through the semiconductor layer 130.

The gate electrode of the sixth transistor T6 may be a part of the light emitting control line 153. A third data connecting member 73 is connected to the second electrode D6 of the sixth transistor T6 through a contact opening 69, and the first electrode S6 is connected to the second electrode D1 of the driving transistor T1 through the semiconductor layer 130.

The gate electrode of the seventh transistor T7 may be a part of the second scan line 152. The first electrode S7 of the seventh transistor T7 is connected to the second electrode D6 of the sixth transistor T6, and the second electrode D7 is connected to the first electrode S4 of the fourth transistor T4.

The storage capacitor Cst includes the first storage electrode E1 and the second storage electrode E2 which overlap each other with a second gate insulating layer 142 therebetween. The second storage electrode E2 corresponds to the gate electrode 155 of the driving transistor T1, and the first storage electrode E1 may be the extended portion of the storage line 126. Herein, the second gate insulating layer 142 becomes a dielectric, and a capacitance is determined by a charge stored in the storage capacitor Cst and a potential difference between the first and second storage electrodes E1 and E2. By using the first gate electrode 155 as the second storage electrode E2, a space capable of forming the storage capacitor Cst in a space that is narrowed by the channel of the driving transistor T1 occupying a large area in the pixel may be provided.

The driving voltage line 172 is connected to the first storage electrode E1 through a contact opening 68. Accordingly, the storage capacitor Cst stores a charge corresponding to a difference between the driving voltage ELVDD transmitted to the first storage electrode E1 through the driving voltage line 172 and the gate voltage of the first gate electrode 155.

The second data connecting member 72 is connected to the initializing voltage line 127 through an opening 64. An electrode called a pixel electrode is connected to the third data connecting member 73 through a contact opening 81.

A parasitic capacitor control pattern 79 may be disposed between dual gate electrodes of the third transistor T3. For example, the parasitic capacitor control pattern 79 may be disposed between the third transistor T3 and the fourth transistor T4. A parasitic capacitor exists in the pixel, and image quality characteristics may change when the voltage applied to the parasitic capacitor is changed. The driving voltage line 172 is connected to the parasitic capacitor control pattern 79 through a contact opening 66. Therefore, it is possible to prevent the image quality characteristic from being changed by applying the driving voltage ELVDD, which is a constant DC voltage, to the parasitic capacitor. The parasitic capacitor control pattern 79 may be formed in a different area from that shown in the drawings, and a voltage other than the driving voltage ELVDD may be applied.

One end of the first data connecting member 71 is connected to the first gate electrode 155 through the contact opening 61, and the other end thereof is connected to the second electrode D3 of the third transistor T3 and the second electrode D4 of the fourth transistor T4 through the contact opening 63.

One end of the second data connecting member 72 is connected to the first electrode S4 of the fourth transistor T4 through the contact opening 65, and the other end of the second data connecting member 72 is connected to the initializing voltage line 127 through the contact opening 64. In an exemplary embodiment of the present invention, the second data connecting member 72 is connected to the second electrode D7 of the seventh transistor T7 through the contact opening 65.

The third data connecting member 73 is connected to the second electrode of the sixth transistor T6 through the contact opening 69.

A stacked structure of the light emitting display device according to the present exemplary embodiment of the present invention will be described with reference to FIG. 2 and FIG. 3.

The light emitting display device according to the present exemplary embodiment includes a substrate 110. For example, the substrate 110 may be an insulating substrate 110 including insulating material. The insulating substrate 110 may include a plastic layer and/or a barrier layer. For example, the plastic layer and the barrier layer may be alternatively stacked.

The plastic layer may include at least one of polyether sulfone (PES), polyacrylate (PAR), polyether imide (PEI), polyimide imide, polyethylene naphthalate (PEN), polyethylene terephthalate (PET), polyphenylene sulfide (PPS), polyarylate, polyimide (PI), polycarbonate (PC), poly (arylene ether sulfone), or a combination thereof. The barrier layer may include at least one of a silicon oxide, a silicon nitride, or an aluminum oxide, but the present invention is not limited thereto, and may include any inorganic material.

A buffer layer 112 is disposed on the insulating substrate 110. The buffer layer 112 may include an inorganic insulating material such as a silicon oxide, a silicon nitride, or an aluminum oxide, and/or may include an organic insulating material such as polyimide acryl.

The semiconductor layer 130, the first electrode, and the second electrode is disposed on the buffer layer 112. For example, each channel of the plurality of transistors T1, T2, T3, T4, T5, T6, and T7 is disposed on the buffer layer 112.

A first gate insulating layer 141 covering the semiconductor layer 130 is disposed on the semiconductor layer 130. A first gate conductor including the first gate electrode 155, the first scan line 151, the second scan line 152, and the light emitting control line 153 is disposed on the first gate insulating layer 141.

The second gate insulating layer 142 covering the first gate conductor is disposed on the first gate conductors 155, 151, 152, and 153. The first gate insulating layer 141 and the second gate insulating layer 142 may include an inorganic insulating material such as a silicon nitride, a silicon oxide, and an aluminum oxide, or an organic insulating material.

A second gate conductor including the storage line 126, the initializing voltage line 127, and the parasitic capacitor control pattern 79 is disposed on the second gate insulating layer 142, interlayer insulating layer 160 covering the second gate conductor is disposed on the second gate conductor. The interlayer insulating layer 160 may include an inorganic insulating material such as a silicon nitride, a silicon oxide, and an aluminum oxide, and/or may include an organic insulating material.

A data conductor including the data line 171, the driving voltage line 172, the first data connecting member 71, the second data connecting member 72, and the third data connecting member 73 is disposed on the interlayer insulating layer 160. The first data connecting member 71 may be connected to the first gate electrode 155 through the contact opening 61.

A passivation layer 180 covering the data conductor is disposed the data conductor. For example, the passivation layer 180 may be an insulating layer, and may include an organic insulating material and/or an inorganic insulating material. The passivation layer 180 is formed with protrusions and depressions on an upper surface thereof due to a thickness of the data conductor. For example, the passivation layer 180 has an upper surface that is uneven. As an additional example, the unevenness of the upper surface of the passivation layer 180 may include protrusions formed at the upper surface of the passivation layer 180 and corresponding to the data connecting member 71 and the driving voltage line 172, and may also include depressions formed at the upper surface of the passivation layer 180 and adjacent to the protrusions.

A light-emitting diode LED includes a diode first electrode 191 that is disposed on the passivation layer 180. The diode first electrode 191 is connected to the third data connecting member 73 through the contact hole 81 formed in the passivation layer 180. A partition wall 350 is disposed on the passivation layer 180 and the diode first electrode 191. The diode first electrode 191 also includes a protrusion-depression shape by the protrusions and depressions formed on the upper surface of the passivation layer 180. For example, the diode first electrode 191 includes an upper surface that is uneven. As an additional example, the unevenness of the upper surface of the diode first electrode 191 may correspond to the unevenness of the upper surface of the passivation layer 180. For example, the unevenness of the upper surface of the diode first electrode 191 and the unevenness of the upper surface of the passivation layer 180 may extend beyond the opening 351 of the partition wall 350.

The partition wall 350 has an opening 351 overlapping the diode first electrode 191. A light emitting layer 370 is disposed on the diode first electrode 191 in the opening 351. A diode second electrode 270 is disposed on the light emitting layer 370 and the partition wall 350. The diode first electrode 191, the light emitting layer 370, and the diode second electrode 270 form a light emitting diode LED. For example, the diode first electrode 191 may include a reflective metallic material, and the diode second electrode 270 may include a transparent metallic material. The light emitting layer 370 may include an organic material or an inorganic material.

In an exemplary embodiment of the present invention, the diode first electrode 191 may be an anode that is a hole injecting electrode, and the diode second electrode 270 may be a cathode that is an electron injecting electrode. In addition, the diode first electrode 191 may be a cathode, and the diode second electrode 270 may be an anode. When holes and electrons are injected into the light emitting layer 370 from the diode first electrode 191 and the diode second electrode 270, respectively, light is emitted as excitons, which are formed from the injected holes combining with the injected electrons, transition to a ground state from an excited state.

An encapsulation layer 400 may protect the light emitting diode LED and is disposed on the diode second electrode 270. For example, the encapsulation layer 400 may be in contact with the diode second electrode 270, and in an exemplary embodiment of the present invention, the encapsulation layer 400 may be spaced apart from the diode second electrode 270.

The encapsulation layer 400 may be a thin film encapsulation layer in which an inorganic film and an organic film are stacked, and may include a triple layer formed of an inorganic film, an organic film, and an inorganic film. In an exemplary embodiment of the present invention, a capping layer and a functional layer may be disposed between the diode second electrode 270 and the encapsulation layer 400.

In addition, the opening 351 of the partition wall 350 overlaps the driving voltage line 172 and the first data connecting member 71. Accordingly, a portion of the diode first electrode 191, in which the diode first electrode 191 overlaps the opening 351, has a protrusion-depression shape, and the light emitting layer 370 and the diode second electrode 270 disposed in the opening 351 also have a protrusion-depression shape. For example, the protrusion-depression shape may be an alternating arraignment of protrusions (or, e.g., convex portions) and depressions (or, e.g., concave portions). For example, a layer or element with a protrusion-depression shape may have at least one of an uneven upper surface or an uneven lower surface. Such a protrusion-depression shape may cause a color change depending on a viewing angle. In the present exemplary embodiment, by adjusting an area of right and left inclined surfaces of the driving voltage line 172 and an area of right and left inclined surfaces the first data connecting member 71 overlapping the opening 351, it is possible to reduce occurrence of a color change depending on the viewing angle, thereby increasing the viewing angle of the light emitting display device without an occurrence of a color change.

This will be described with reference to FIG. 4 and FIG. 5.

Figure 4:
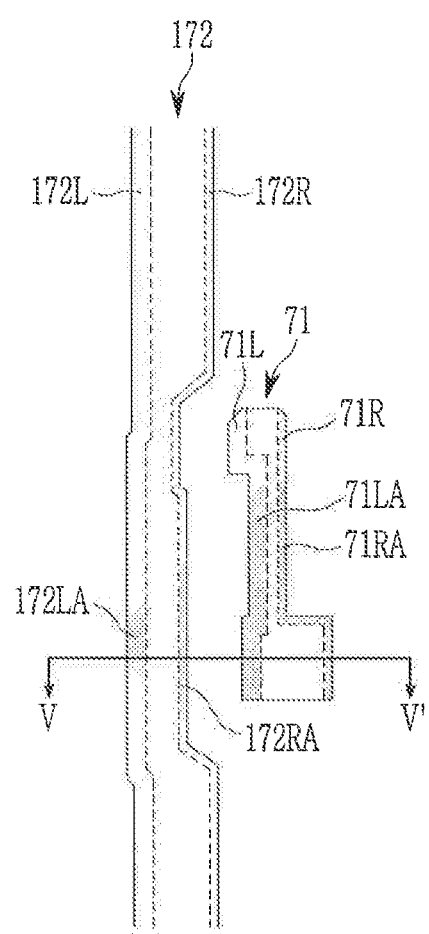
FIG. 4 illustrates a schematic plan view of a driving voltage line and a first data connecting member of the light emitting display device of FIG. 2 according to an exemplary embodiment of the present invention.

FIG. 4 illustrates a schematic plan view of a driving voltage line and a first data connecting member of the light emitting display device of FIG. 2 according to an exemplary embodiment of the present invention. FIG. 5 illustrates a cross-sectional view taken along line V-V' of the driving voltage line and the first data connecting member of FIG. 4 according to an exemplary embodiment of the present invention.

Figure 5:
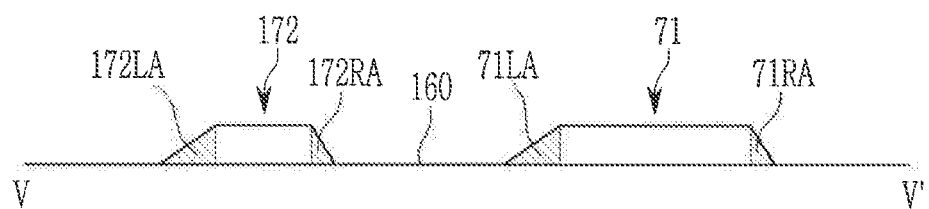
FIG. 5 illustrates a cross-sectional view taken along line V-V' of the driving voltage line and the first data connecting member of FIG. 4 according to an exemplary embodiment of the present invention.

Referring to FIGS. 4 and 5, the driving voltage line 172 and the first data connecting member 71 are spaced apart from each other, and they are disposed on the interlayer insulating layer 160. For example, the driving voltage line 172 and the first data connecting member 71 are are disposed on the same layer.

The driving voltage line 172 and the first data connecting member 71 include left inclined surfaces 172L and 71L and right inclined surfaces 172R and 71R, respectively. Here, the left and right sides indicate left and right sides with respect to a center of the driving voltage line 172 and the first data connecting member 71 in a plan view, respectively. An area of the left inclined surface 172L of the driving voltage line 172 is larger than that of the right inclined surface 172R. An area of the left inclined surface 71L of the first data connecting member 71 is larger than that of the right inclined surface 71R.

In a comparative example, an area of a left inclined surface of the driving voltage line is equal to that of a right inclined surface thereof, and an area of a left inclined surface of a first data connecting member is equal to that of a right inclined surface thereof. In this case, an area of a portion of the driving voltage line, in which the left inclined surface of the driving voltage line overlaps an opening of a partition wall, may be different from that of another portion of the driving voltage line, in which the right inclined surface of the driving voltage line overlaps the opening. In addition, an area of a portion of the first data connecting member, in which the left inclined surface of the first data connecting member overlaps the opening of the partition wall, ma be different from that of another portion of the first data connecting member 71, in which the right inclined surface of the first data connecting member overlaps the opening. Accordingly, in the comparative example, a sum of the areas of the left inclined surfaces of the protrusion-protrusion shape of the diode first electrodes overlapping the opening of the partition wall is different from that of the areas of the right inclined surfaces thereof, and thus, amounts of light reflected by the right and left inclined surfaces of the protrusion-depression shape of the diode first electrode may be different from each other. Therefore, a color change depending on the right and left viewing angles may occur.

In the embodiment of the present invention shown in FIGS. 4 and 5, the driving voltage line 172 and the first data connecting member 71 partially overlap the opening 351 of the partition wall 350, and the opening 351 has a polygonal shape (see, e.g., FIG. 2). For example, the opening 351 may have a rhombic shape. In the embodiment of the present invention shown shown in FIGS. 4 and 5, the portion of the left inclined surface 172L of the driving voltage line 172 overlapping the opening 351 of the partition wall 350 may be referred to as a left inclined surface overlap portion 172LA, and the portion of the right inclined surface 172R of the driving voltage line 172 overlapping the opening 351 may be referred to as a right inclined surface overlap portion 172RA. The portion of the left inclined surface 71L of the first data connecting member 71 overlapping the opening 351 of the partition wall 350 may be referred to as a left inclined surface overlap portion 71LA, and the portion of the right inclined surface 71R of the first data connecting member 71 overlapping the opening 351 may be referred to as a right inclined surface overlap portion 71RA. Here, a sum of an area of the left inclined surface overlap portion 172LA of the driving voltage line 172 and an area of the left inclined surface overlap portion 71LA of the first data connecting member 71 is equal to a sum of an area of the right inclined surface overlap portion 172RA of the driving voltage line 172 and an area of the right inclined surface overlap portion 71RA of the first data connecting member 71. Accordingly, the sum of the areas of the left inclined surfaces of the protrusion-protrusion shape of the diode first electrodes 191 overlapping the opening 351 of the partition wall 350 is the same as that of the areas of the right inclined surfaces thereof, and thus, the amounts of light reflected by the right and left inclined surfaces of the protrusion-depression shape of the diode first electrode 191 are the same. Therefore, it is possible to reduce the occurrence of the color change depending on the right and left viewing angles.

In FIG. 4, for example, the area of the left inclined surface overlap portion 172LA corresponds to a shaded area located along the left inclined surface 172L of the driving voltage line 172, and the area of the right inclined surface overlap portion 172RA corresponds to a shaded area located along the right inclined surface 172R of the driving voltage line 172. In addition, the area of the left inclined surface overlap portion 71LA corresponds to a shaded area located along the left inclined surface 71L of the first data connecting member 71, and the area of the right inclined surface overlap portion 71RA corresponds to a shaded area located along the right inclined surface 71R of the first data connecting member 71.

In the present exemplary embodiment, the driving voltage line 172 and the first data connecting member 71 are described as a data conductor overlapping the opening 351 of the partition wall 350 among the data conductors (e.g., 171, 172, 71, 72, 73 and 160), but the present invention is not limited thereto, and other data conductors may overlap the opening 351. For example, in this case, even though the sum of the areas of the portions of the left inclined surfaces of the data conductor overlapping the opening 351 of the partition wall 350 equal to the sum of the areas of the portions of the right inclined surfaces of the data conductor overlapping the opening 351, a sum of the entire areas of the left inclined surfaces of the data conductor may be different from a sum of the entire areas of the right inclined surfaces thereof. As an additional example, the area of a first left inclined surface of the data conductor may be different from the area of a first right inclined surface of the data conductor.

A method for manufacturing a light emitting display device according to an exemplary embodiment of the present invention will now be described with reference to FIG. 6 to FIG. 8, and FIG. 2, FIG. 3, and FIG. 5 as well.

Figure 6:
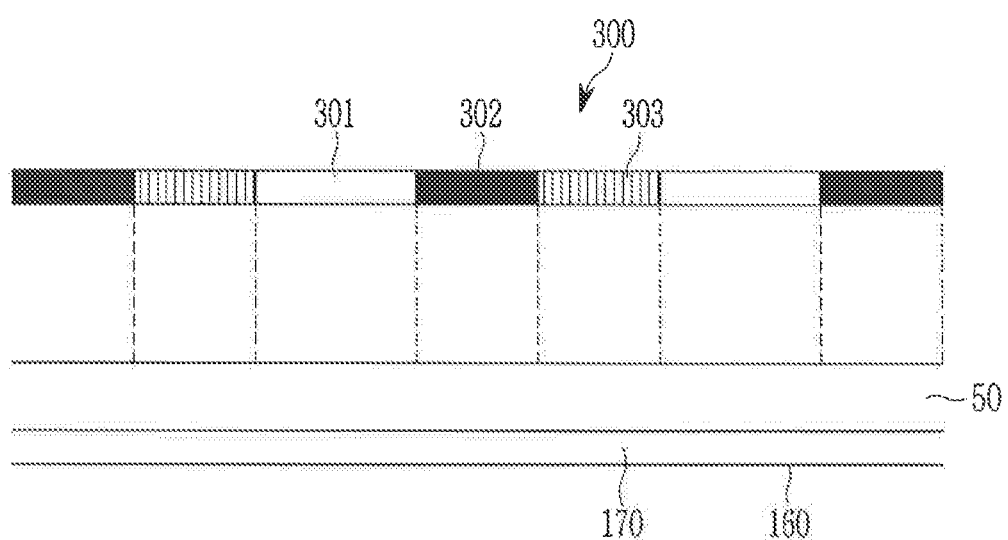
FIGS. 6, 7 and 8 illustrate schematic views of a method for manufacturing a light emitting display device according to an exemplary embodiment of the present invention.
Figure 7:
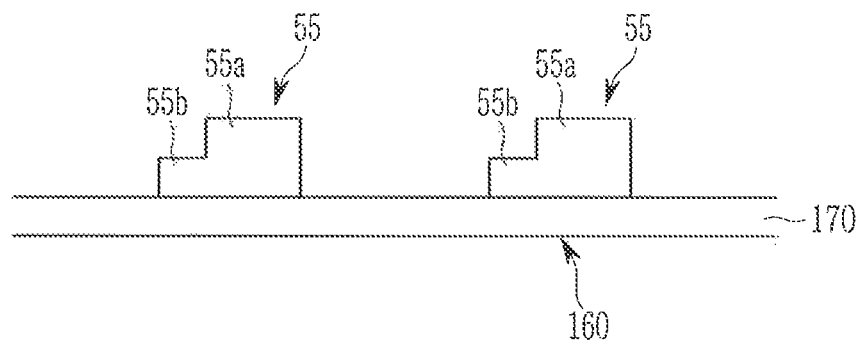
Figure 8:
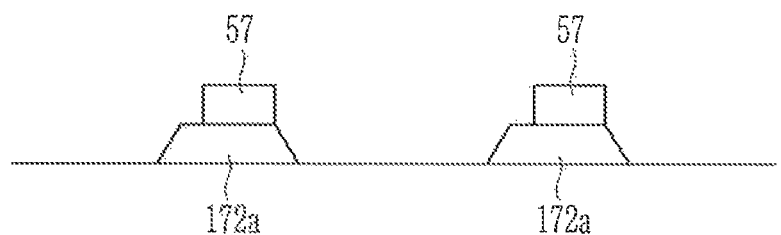

FIG. 6 to FIG. 8 illustrate schematic views of a method for manufacturing a light emitting display device according to an exemplary embodiment of the present invention.

Referring to FIG. 2 and FIG. 3, the buffer layer 112, the semiconductor layer 130, the first gate insulating layer 141, the first gate conductor, the second gate insulating layer 142, the second gate conductor, and the interlayer insulating layer 160 are sequentially formed on the insulating substrate 110. Here, the first gate conductor includes the first gate electrode 155, the first scan line 151, the second scan line 152, and the light emitting control line 153, and the second gate conductor includes the storage line 126, the initializing voltage line 127, and the parasitic capacitor control pattern 79.

Referring to FIG. 6, a data metal layer 170 is formed on the interlayer insulating layer 160, a photosensitive layer 50 is formed on the data metal layer 170, and then the photosensitive layer 50 is irradiated with light while using a photomask 300. The photomask 300 is a half-tone mask including a light transmitting portion 301 through which light is transmitted, a light blocking portion 302 that blocks light, and a light semi-transmitting portion 303 through which light is partially transmitted.

Referring to FIG. 7, a first photosensitive layer pattern 55 is formed on the data metal layer 170 by irradiating the photosensitive layer 50 with light while using the photomask 300. The first photosensitive layer pattern 55 includes a first portion 55a, and a second portion 55b that is thinner than the first portion 55a. The first portion 55a corresponds to the light transmitting portion 301 of the photomask 300, and the second portion 55b corresponds to the light semi-transmitting portion 303 of the photomask 300.

Referring to FIG. 8, the data metal layer 170 is etched using the first photosensitive layer pattern 55 as a mask to form a preliminary data conductor 172a, then the first photosensitive layer pattern 55 is subjected to an aching process to form a second photosensitive layer pattern 57. When the first photosensitive layer pattern 55 is subjected to an ashing process, the second portion 55b is removed, and a thickness of the first portion 55a is reduced. In this case, an area of a left inclined surface of the preliminary data conductor 172a is equal to that of a right inclined surface of the preliminary data conductor 172a.

Referring to FIG. 5, the preliminary data conductor 172a is etched using the second photosensitive layer pattern 57 as a mask to form a data conductor including the driving voltage line 172 and the first data connecting member 71. In this case, the data conductor may further include the data line 171, the second data connecting member 72, and the third data connecting member 73 (see, e.g., FIG. 2 and FIG. 3).

Referring back to FIGS. 2 and 3, the passivation layer 180 is formed on the data conductor, the diode first electrode 191 is formed on the passivation layer 180, and then the partition wall 350 provided with the opening 351 overlapping the diode first electrode 191 is formed on the passivation layer 180 and the diode first electrode 191. Next, the light emitting layer 370 is formed on the diode first electrode 191 in the opening 351. Then, the diode second electrode 270 is formed on the light emitting layer 370 and the partition wall 350, and then the encapsulation layer 400 is formed on the diode second electrode 270.

In addition, to make the sum of the area of the left inclined surface overlap portion 172LA of the driving voltage line 172 and the area of the left inclined surface overlap portion 71LA of the first data connecting member 71 equal to the sum of the area of the right inclined surface overlap portion 172RA of the driving voltage line 172 and the area of the right inclined surface overlap portion 71RA of the first data connecting member 71, various structures may be applied. This will be described with reference to FIG. 9 and FIG. 20.

Figure 9:
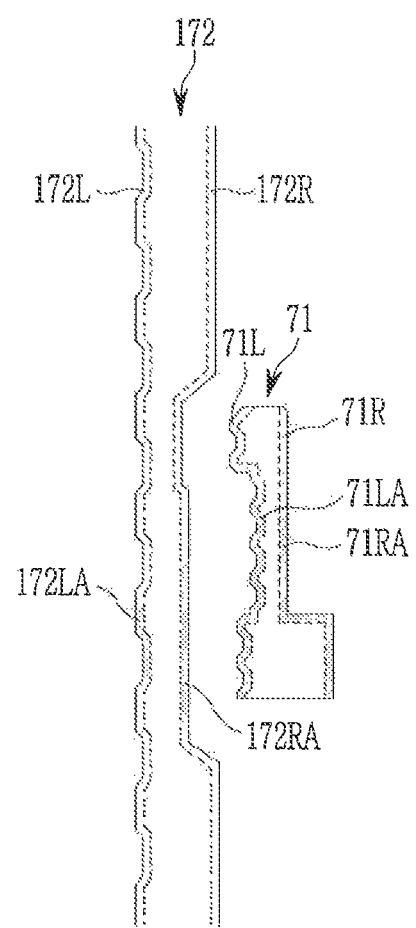
FIG. 9 and FIG. 10 illustrate a schematic plan view of a driving voltage line and a first data connecting member of a light emitting display device, respectively, according to an exemplary embodiment of the present invention.
Figure 10:
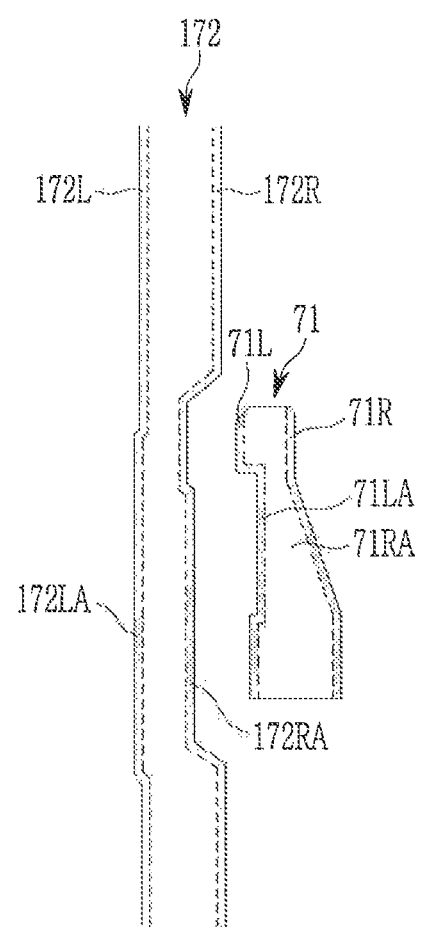

FIG. 9 and FIG. 10 illustrate a schematic plan view of a driving voltage line and a first data connecting member of a light emitting display device, respectively, according to an exemplary embodiment of the present invention.

Referring to FIG. 9, the driving voltage line and the first data connecting member of the light emitting display device according to the present exemplary embodiment differ from those of the light emitting display device described, in FIG. 2, and the remaining structures and elements are the same. Thus, redundant descriptions may be omitted.

The driving voltage line 172 and the first data connecting member 71 include left inclined surfaces 172L and 71L and right inclined surfaces 172R and 71R, respectively. The left inclined surface 172L of the driving voltage line 172 has a zigzag shape in a plan view. For example, the left inclined surface 172L may have protrusions and indentations alternatively positioned. In addition, the left inclined surface 71L of the first data connecting member 71 has a zigzag shape in a plan view. For example, the left inclined surface 71L may have protrusions and indentations alternatively positioned. Accordingly, the area of the left inclined surface 172L of the driving voltage line 172 is larger than that of the right inclined surface 172R thereof, and the area of the left inclined surface 71L of the first data connecting member 71 is larger than the area of the right inclined surface 71R thereof.

Therefore, the sum of the area of the left inclined surface overlap portion 172LA of the driving voltage line 172, which is the portion of the left inclined surface 172L of the driving voltage line 172 overlapping the opening 351 of the partition wall 350, and the area of the left inclined surface overlap portion 71LA of the first data connecting member 71 which is the portion of the left inclined surface 71L of the first data connecting member 71 overlapping the opening 351 of the partition wall 350, is the same as that of the area of the right inclined surface overlap portion 172RA of the driving voltage line 172, which is the portion of the right inclined surface 172R of the driving voltage line 172 overlapping the opening 351 of the partition wall 350, and the area of the right inclined surface overlap portion 71RA of the first data connecting member 71, which is the portion of the right inclined surface 71R of the first data connecting member 71 overlapping the opening 351 of the partition wall 350.

In FIG. 9, for example, the areas of the left and right inclined surface overlap portions 172LA and 172RA of the driving, voltage line 172 and the areas of the left and right inclined surface overlap portions 71LA and 71RA of the first data connecting member 71 are similarly shaded as those shown in FIG. 4.

Referring to FIG. 10, the driving voltage line and the first data connecting member of the light emitting display device according to the present exemplary embodiment differ from those of the light emitting display device described in FIG. 2, and the remaining structures and elements are the same. Thus, redundant descriptions may be omitted.

The driving voltage line 172 and the first data connecting member 71 include left inclined surfaces 172L and 71L and right inclined surfaces 172R and 71R, respectively.

The area of the left inclined surface 172L of the driving voltage line 172 is the same as that of the right inclined surface 172R thereof.

Compared with the light emitting display device according to FIG. 2 and FIG. 4, a length of a right side of the first data connecting member 71 is shortened so that the area of the right inclined surface 71R is narrower than the area of the left inclined, surface 71L in a plan view. In addition, the left inclined surface 71L of the first data connecting member 71 is narrower than the left inclined surface 71L of the first data connecting member 71 in FIGS. 2 and 4.

Therefore, the sum of the area of the left inclined surface overlap portion 172LA of the driving voltage line 172, which is the portion of the left inclined surface 172L of the driving voltage line 172 overlapping the opening 351 of the partition wall 350, and the area of the left inclined surface overlap portion 71LA of the first data connecting member 71, which is the portion of the left inclined surface 71L of the first data connecting member 71 overlapping the opening 351 of the partition wall 350, is the same as that of the area of the right inclined surface overlap portion 172RA of the driving voltage line 172, which is the portion of the right inclined surface 172R of the driving voltage line 172 overlapping the opening 351 of the partition wall 350, and the area of the right inclined surface overlap portion 71RA of the first data connecting member 71, which is the portion of the right inclined surface 71R of the first data connecting member 71 overlapping the opening 351 of the partition wall 350.

The present invention provides a light emitting display device that may increase a viewing angle without a color changing occurring.

According to an exemplary embodiment of the present invention, it is possible to increase a viewing angle by adjusting an area of right and left inclined surfaces of a data conductor to reduce an occurrence of a color change according to the viewing angle.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. A light emitting display device, comprising:
a substrate;
a semiconductor layer disposed on the substrate;
a first gate insulating layer disposed on the semiconductor layer;
a first gate conductor disposed on the first gate insulating layer;
a second gate insulating layer disposed on the first gate conductor;
a second gate conductor disposed on the second gate insulating layer;
an interlayer insulating layer disposed on the second gate conductor;
a data conductor disposed on the interlayer insulating layer;
a passivation layer disposed on the data conductor;
a diode first electrode disposed on the passivation layer;
a partition wall disposed on the diode first electrode and including an opening overlapping the diode first electrode;
a light emitting layer disposed on the diode first electrode in the opening; and
a diode second electrode disposed on the light emitting layer,
wherein the data conductor includes a first upper side inclined surface and a second upper side inclined surface opposing the first upper side inclined surface,
wherein the first upper side inclined surface includes a first portion overlapping the opening,
wherein the second upper side inclined surface includes a second portion overlapping the opening,
wherein the data conductor further includes a driving voltage line, wherein the driving voltage line includes a third upper side inclined surface and a fourth upper side inclined surface opposing the third upper side inclined surface,
wherein the third upper side inclined surface includes a third portion overlapping the opening,
wherein the fourth upper side inclined surface includes a fourth portion overlapping the opening, and
an area of the first upper side inclined surface is different from an area of the second upper side inclined surface,
wherein the diode first electrode includes a first inclined surface and a second inclined surface, wherein the first inclined surface corresponds to the third upper side inclined surface of the driving voltage line, and wherein the second inclined surface corresponds to the fourth upper side inclined surface of the driving voltage line.

2. The light emitting display device of claim 1, wherein a sum of an area of the first upper side inclined surface overlap portion and an area of the third upper side inclined surface overlap portion is the same as a sum of an area of the second upper side inclined surface overlap portion and an area of the fourth upper side inclined surface overlap portion.

3. The light emitting display device of claim 2, wherein the area of the first upper side inclined surface is larger than the area of the second upper side inclined surface.

4. The light emitting display device of claim 2, wherein the first upper side inclined surface includes protrusions and indentations alternatively positioned.

5. The light emitting display device of claim 1, wherein an upper surface of the passivation layer includes protrusions and depressions, and the diode first electrode includes protrusions and depressions.

6. The light emitting display device of claim 5, wherein the protrusions and depressions of the diode first electrode overlap the opening of the partition wall.

7. A light emitting display device, comprising:
a substrate;

a driving transistor disposed on the substrate and including a first gate electrode;
an interlayer insulating layer disposed on the first gate electrode;
a data conductor disposed on the interlayer insulating layer and including a data connecting member and a driving voltage line;
a passivation layer disposed on the data conductor;
a diode first electrode disposed on the passivation layer;
a partition wall disposed on the diode first electrode and including an opening overlapping the diode first electrode;
a light emitting layer disposed on the diode first electrode in the opening; and
a diode second electrode disposed on the light emitting layer,
wherein the data connecting member is connected to the first gate electrode of the driving transistor,
wherein the data connecting member includes a first upper side inclined surface and a second upper side inclined surface opposing the first upper side inclined surface, and the driving voltage line includes a third upper side inclined surface and a fourth upper side inclined surface opposing the third upper side inclined surface,
wherein the first upper side inclined surface includes a first portion overlapping the opening,
wherein the second upper side inclined surface includes a second portion overlapping the opening,
wherein the third upper side inclined surface includes a third portion overlapping the opening,
wherein the fourth upper side inclined surface includes a fourth portion overlapping the opening,
wherein a sum of an area of the first portion and an area of the third portion is the same as a sum of an area of the second portion and an area of the fourth portion,
wherein the diode first electrode includes a first inclined surface a second inclined surface, wherein the first inclined surface corresponds to the first upper side inclined surface of the data connecting member, and wherein the second inclined surface corresponds to the second upper side inclined surface of the data connecting member.

8. The light emitting display device of claim 7, wherein the diode first electrode overlaps the data connecting member and the driving voltage line.

* * * * *